US006977865B2

(12) United States Patent
Jeong (10) Patent No.: US 6,977,865 B2
(45) Date of Patent: Dec. 20, 2005

(54) METHOD AND CIRCUIT FOR CONTROLLING OPERATION MODE OF PSRAM

(75) Inventor: Duk Ju Jeong, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/881,430

(22) Filed: Jun. 30, 2004

(65) Prior Publication Data

US 2005/0232065 A1   Oct. 20, 2005

(30) Foreign Application Priority Data

Apr. 20, 2004   (KR) ...................... 10-2004-0027112

(51) Int. Cl.[7] .............................................. G11C 8/00
(52) U.S. Cl. ............... 365/233; 365/230.08; 365/233.5
(58) Field of Search .......................... 365/233, 230.08, 365/233.5

(56) References Cited

U.S. PATENT DOCUMENTS

| 5,384,737 A | * | 1/1995 | Childs et al. .......... 365/189.05 |
| 6,128,308 A | | 10/2000 | Kuo et al. ................... 370/428 |
| 6,438,102 B1 | | 8/2002 | Chui et al. ................... 370/229 |
| 6,532,184 B2 | * | 3/2003 | Chun .......................... 365/233 |
| 6,591,354 B1 | | 7/2003 | Mick et al. ................. 711/169 |
| 2003/0221037 A1 | | 11/2003 | Van Dyke et al. .......... 710/305 |
| 2004/0081169 A1 | | 4/2004 | Kloth et al. ........... 370/395.51 |

FOREIGN PATENT DOCUMENTS

JP   2004-5683   1/2004   ........... G06F 13/42

\* cited by examiner

*Primary Examiner*—Huan Hoang
(74) *Attorney, Agent, or Firm*—Marshall, Gerstein & Borun LLP (57) ABSTRACT

The present invention discloses a method and circuit for controlling an operation mode of a pseudo SRAM (PSRAM), a PSRM having the same, and a method for performing an operation mode thereof. When a clock is toggled and inputted in a synchronous mode in a chip-enabled state, a synchronous write and synchronous read operation is performed, and when the clock is not toggled, an asynchronous write operation is performed. Therefore, the asynchronous write and synchronous read operation and the synchronous write and synchronous read operation can be performed at the same time. Accordingly, an efficient interface is provided between the PSRAM and a NOR flash memory device.

19 Claims, 7 Drawing Sheets

METHOD AND CIRCUIT FOR
CONTROLLING OPERATION MODE OF
PSRAM

This application relies for priority upon Korean Patent Application No. 2004-0027112 filed on Apr. 20, 2004, the contents of which are herein incorporated by reference in their entirety.

BACKGROUND

1. Field of the Invention

The present invention relates to a method and circuit for controlling an operation mode of a pseudo SRAM (PSRAM), a PSRM having the same, and a method for performing an operation mode thereof, and more particularly to, a method and circuit for controlling an operation mode of a PSRAM which can implement a mixed mode for simultaneously performing an asynchronous write operation and a synchronous write and synchronous read operation in a state where a synchronous mode is set by a mode register set, a PSRM having the same, and a method for performing an operation mode thereof.

2. Discussion of Related Art

In a semiconductor memory device, a random access memory (RAM) implements random access storage, and records and reads information. The RAM has been widely used for a computer or peripheral terminal apparatus. The RAM is advantageous in low price, small size, low power consumption, high speed call and nondestructive readout, but disadvantageous in that the whole stored data are deleted in power-off. The RAM is classified into a dynamic RAM (DRAM) in which information is prevented from being deleted by performing a refresh operation at an interval of a predetermined period in power-on, and a static RAM (SRAM) in which information is not deleted in power-on.

As explained above, a memory in which information is deleted in power-off is called a volatile memory, and a memory in which information is not deleted even in power-off, such as a read only memory (ROM) is called a non-volatile memory. The SRAM is advantageous in access to an integrated circuit. However, if the SRAM has the same memory capacity as that of the DRAM, it requires elements three to four times as many as the DRAM. That is, the SRAM is more complicated and high-priced.

Accordingly, researches have been recently actively made on a PSRAM for implementing the operation of the SRAM by using a DRAM cell. As compared with the general SRAM, the PSRAM reduces a chip size and achieves high integration of 16 Mbit, 32 Mbit and 64 Mbit. However, the PSRAM has the same cell structure as that of the DRAM, and thus internally performs a refresh operation.

An operation mode for controlling the operation of the PSRAM is roughly divided into three, an asynchronous write and asynchronous read mode (asynchronous mode), an asynchronous write and synchronous read mode (mixed mode) and a synchronous write and synchronous read mode (synchronous mode). Such operation modes are selected by a mode register set. Once the operation mode is selected by the mode register set, the PSRAM is continuously operated in the selected operation mode. In order to operate the PSRAM in another operation mode, the operation mode is newly set by the mode register set. Here, the PSRAM is operated in the newly-set operation mode.

For the interface between the PSRAM and a NOR flash memory device, in a state where the synchronous mode is set, a synchronous write and synchronous read operation and an asynchronous write and synchronous read operation must be performed at the same time. However, when one of the three operation modes is selected by the mode register set, the asynchronous write and synchronous read operation and the synchronous write and synchronous read operation cannot be simultaneously performed.

SUMMARY OF THE INVENTION

The present invention is directed to a method and circuit for controlling an operation mode of a PSRAM which can simultaneously perform a mixed mode operation such as an asynchronous write and synchronous read operation, and a synchronous write and synchronous read operation in a state where a synchronous mode is set by a mode register set, a PSRM having the same, and a method for performing an operation mode thereof.

One aspect of the present invention is to provide a method for controlling an operation mode of a PSRAM which performs a synchronous write and synchronous read operation by enabling a word line according to an valid address bar signal when a clock is toggled, and performs an asynchronous write operation by enabling the word line by toggling an external address when the clock is not toggled, in order to change an enable time point of the word line by varying an external address path according to toggling/non-toggling of the clock in a chip-enabled state after entering into a synchronous mode by a mode register setting signal.

According to another aspect of the present invention, a circuit for controlling an operation mode of a PSRAM includes: a mixed mode operation control unit for deciding toggling/non-toggling of a clock according to a mode register setting signal in a chip-enabled state, and outputting a corresponding mixed mode operation control signal; an address valid buffer unit for deciding whether a current mode is a synchronous mode or an asynchronous mode according to the mode register setting signal and an valid address bar signal from an input/output pad on the basis of the mixed mode operation control signal from the mixed mode operation control unit; an address buffer unit for deciding different external address transmission paths in the synchronous mode and the asynchronous mode according to the mode register setting signal, an external address and the clock on the basis of an address valid buffer signal from the address valid buffer unit; and an address transition detection summation unit for generating an address summation signal for deciding the external address transmission path in the asynchronous mode according to the mode register setting signal and the mixed mode operation control signal on the basis of an address transition detection bar signal from the address buffer unit, and outputting the address summation signal to the address buffer unit.

According to yet another aspect of the present invention, a PSRAM includes: a memory cell array having a plurality of memory cells; a main decoder unit for selecting the corresponding memory cell from the memory cells of the memory cell array; and a circuit for controlling an operation mode which transmits an external address to the main decoder unit, for performing an asynchronous write operation or a synchronous write and synchronous read operation in a synchronous mode according to toggling/non-toggling of a clock.

According to yet another aspect of the present invention, a method for performing a mixed mode of a PSRAM includes the steps of: deciding, at a mixed mode operation control unit, toggling/non-toggling of a clock according to a mode register setting signal in a chip-enabled state; deciding, at an address valid buffer unit, whether a current mode is a synchronous mode or an asynchronous mode according to the mode register setting signal and an valid address bar signal from an input/output pad on the basis of a mixed mode operation control signal from the mixed mode operation control unit; deciding, at an address buffer unit, different external address transmission paths in the synchronous mode and the asynchronous mode according to the mode register setting signal, an external address and the clock on the basis of an address valid buffer signal from the address valid buffer unit; and performing, in the synchronous mode, an asynchronous write operation by toggling the external address when the clock is not toggled, and a synchronous write and synchronous read operation when the clock is toggled.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

A method and circuit for controlling an operation mode of a PSRAM, a PSRM having the same, and a method for performing an operation mode thereof in accordance with preferred embodiments of the present invention will now be described in detail with reference to the accompanying drawings. Wherever possible, the same reference numerals will be used throughout the drawings and the description to refer to the same or like parts.

Figure 1:
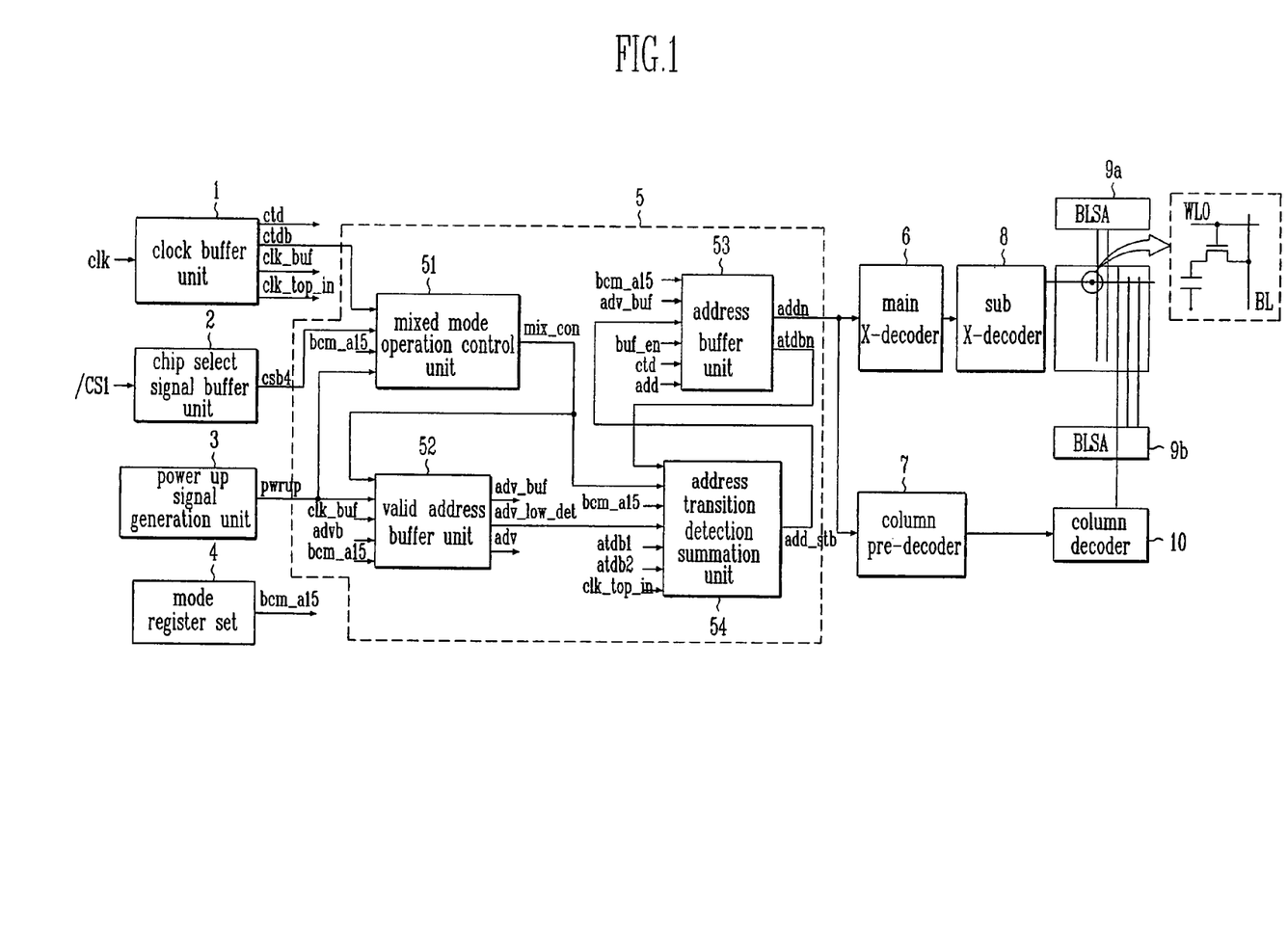
FIG. 1 is a block diagram illustrating a PSRAM in accordance with a preferred embodiment of the present invention.

FIG. 1 is a block diagram illustrating a PSRAM for explaining a circuit for controlling an operation mode of the PSRAM in accordance with a preferred embodiment of the present invention. Reference numeral 5 denotes the circuit for controlling the operation mode.

Referring to FIG. 1, in additional to the circuit 5 for controlling the operation mode, the PSRAM includes a clock buffer unit 1, a chip select signal buffer unit 2, a power up signal generation unit 3, a mode register set 4, a main x-decoder 6, a column pre-decoder 7, a sub x-decoder 8, bit line sense amps 9a and 9b, a column decoder 10 and a memory cell array 11. The PSRAM is identical to the general PSRAM except the circuit 5 for controlling the operation mode, and thus explanations thereof are omitted. Here, the parts relating to the present invention will be explained in association with the present invention.

First, when the operation mode of the PSRAM has been set as a synchronous mode, the circuit 5 for controlling the operation mode controls the operation mode of the PSRAM according to toggling of a clock clk. After the operation mode is set as the synchronous mode by the mode register set 4, if the clock clk is not toggled, the circuit 5 for controlling the operation mode controls an asynchronous write operation to be performed, and if the clock clk is toggled, the circuit 5 for controlling the operation mode controls a synchronous write and synchronous read operation to be performed. The circuit 5 for controlling the operation mode includes a mixed mode operation control unit 51, an valid address buffer unit 52, an address buffer unit 53 and an address transition detection summation unit 54.

The mixed mode operation control unit 51 decides whether the clock clk is toggled or not toggled. The mixed mode operation control unit 51 outputs a mixed mode operation control signal mix_con according to a clock transition detection bar signal ctdb from the clock buffer unit 1. When the clock clk is toggled and inputted to the clock buffer unit 1, the mixed mode operation control unit 51 receives the clock transition detection bar signal ctdb in a low level, and outputs the mixed mode control signal mix_con in a low level. In addition, the mixed mode operation control unit 51 detects a time point of transiting/CS1 to a low level, and transits the mixed mode operation control signal mix_con to a high level. That is, when the mixed mode operation control signal mix_con has a low level, the synchronous write and synchronous read operation is performed, and when the mixed mode operation control signal mix_con has a high level, the asynchronous write operation is performed.

Figure 2:
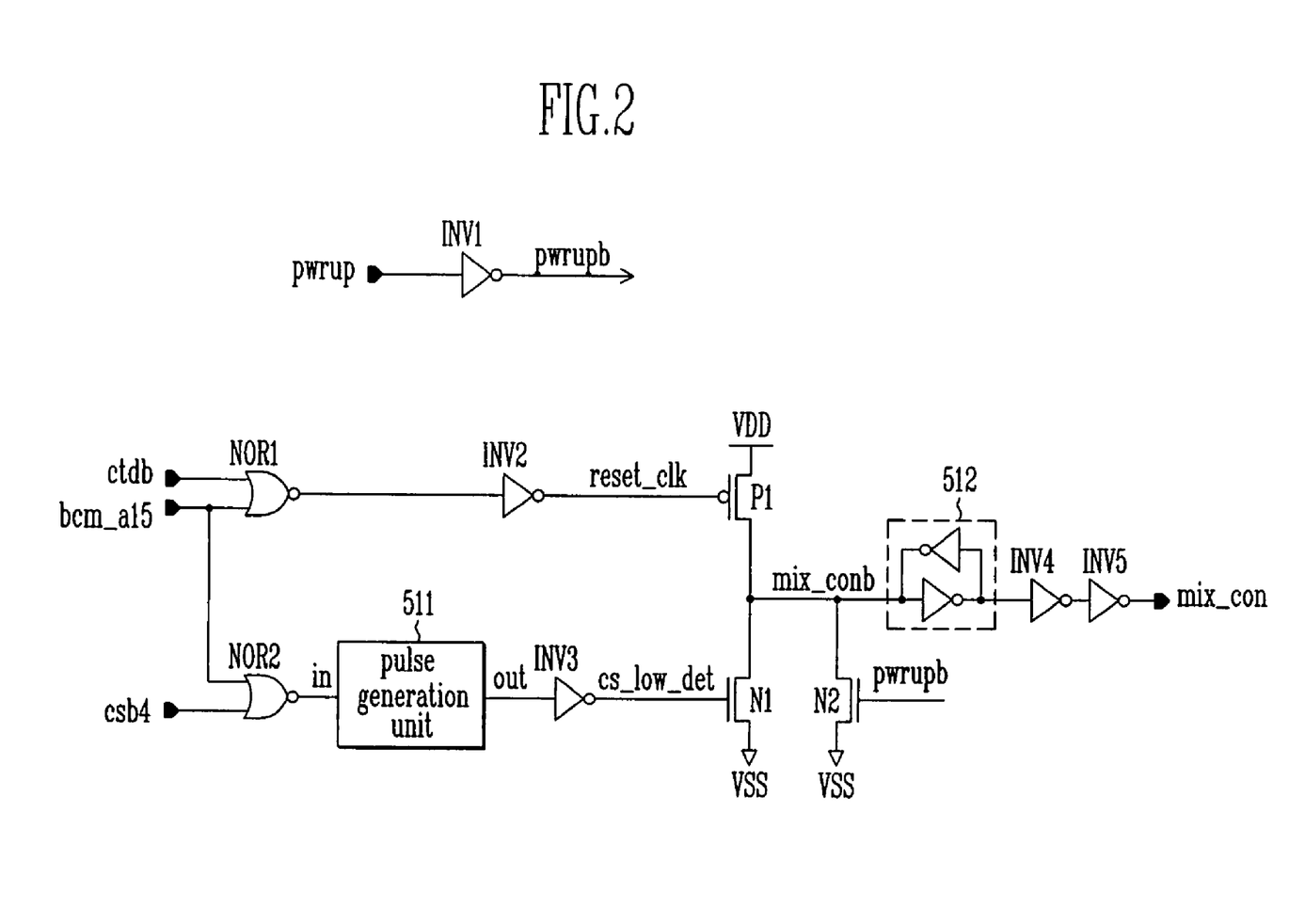
FIG. 2 is a detailed circuit diagram illustrating a mixed mode operation control unit of FIG. 1.

FIG. 2 is a detailed circuit diagram illustrating the mixed mode operation control unit 51 of FIG. 1. As illustrated in FIG. 2, the mixed mode operation control unit 51 includes inverters INV1 to INV5, NOR gates NOR1 and NOR2, a pulse generation unit 511, a PMOS transistor P1, NMOS transistors N1 and N2 and a latch unit 522.

Signals inputted to the mixed mode operation control unit 51 will now be explained with reference to FIG. 1. A power up signal pwrup is transited from a low to high level when power is initially applied to the PSRAM. A mode register setting signal bcm_a15 is fixed to a high level in the asynchronous mode, and fixed to a low level in the synchronous mode. The clock transition detection bar signal ctdb is outputted in a low level whenever the clock is transited from a low to high level (namely, rising). A chip select bar signal csb4 is outputted in a low level when /CS1 is transited to a low level. That is, when a normal mode (/CS1 is low) is enabled in a standby state of the PSRAM (/CS1 is high), the chip select bar signal csb4 has the same phase as that of /CS1.

Figure 7:
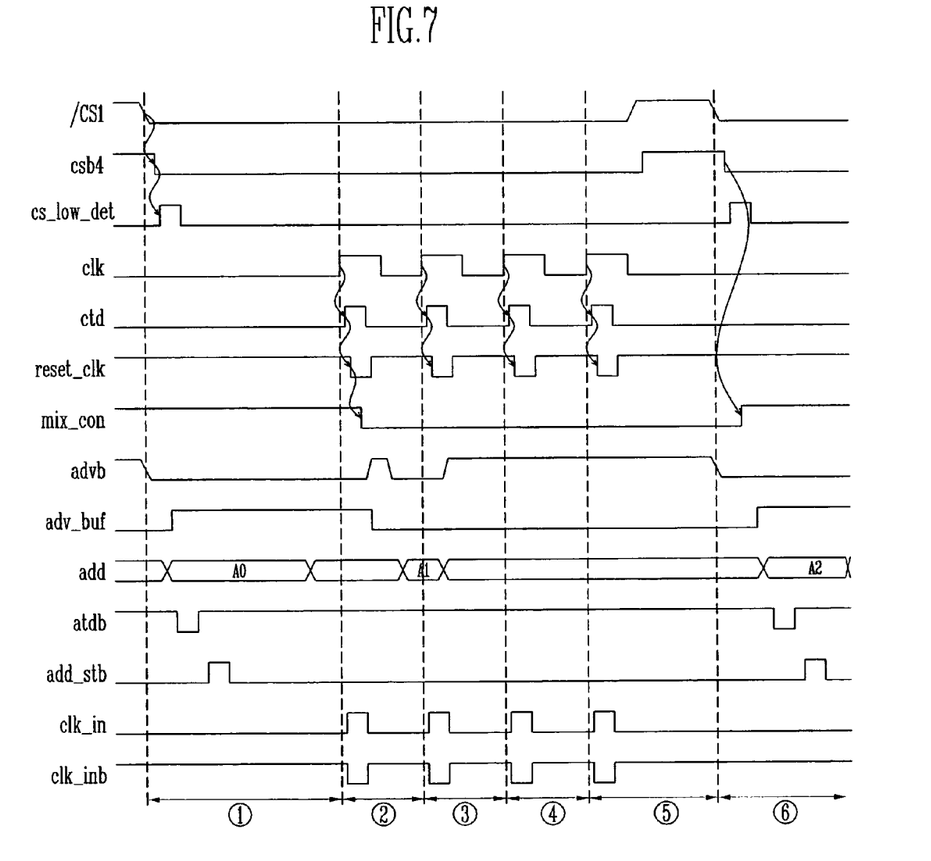
FIG. 7 is an operational waveform diagram of a circuit for controlling an operation mode in accordance with a preferred embodiment of the present invention.

The operational characteristics of the mixed mode operation control unit 51 will now be explained with reference to FIG. 7. When power is not applied to the PSRAM and the power up signal pwrup maintains a low level, the NMOS transistor N2 is turned on by a power up bar signal pwrupb, and a mixed mode operation control bar signal mix_conb is transited to a high level. Accordingly, the mixed mode operation control signal mix_con is outputted in a high level. In this state, when power is applied to the PSRAM and the power up signal pwrup is transited to a high level, the NMOS transistor N2 is turned off. Here, the mixed mode operation control signal mix_con maintains a high level by the latch unit 512.

In the asynchronous mode, the mode register setting signal bcm_a15 is fixed to a high level, and thus the output signal reset_clk from the inverter $INV_2$ has a high level and the output signal cs_low_det from the inverter INV3 has a low level. Therefore, even if the NMOS transistor N2 is turned off, the mixed mode operation control signal mix_con maintains a high level by the latch unit 512. The asynchronous mode is operated in the same manner as when the clock clk is not toggled. In the synchronous mode, the mode register setting signal bcm_a15 is fixed to a low level. In this state, if the clock clk is not toggled, the mixed mode operation control signal mix_con maintains a high level as in the asynchronous mode. However, if the clock transition detection bar signal ctdb is transited to a low level according to toggling of the clock clk, the output signal reset_clk from the inverter INV2 and the output signal cs_low_det from the inverter INV3 are transited to a low level. Accordingly, the PMOS transistor P1 is turned on, and the mixed mode operation control bar signal mix_conb is transited to a high level. As a result, the mixed mode operation control signal mix_con is transited to a low level.

The valid address buffer unit 52 outputs an address valid buffer signal addv_buf for controlling the operation of the address buffer unit 3 by distinguishing the synchronous mode from the asynchronous mode. In addition, the valid address buffer unit 52 detects low level transition of an valid address bar signal advb, and generates an address valid low detection signal adv_low_det. In the synchronous mode, the valid address buffer unit 52 receives the clock clk and generates an address valid adv.

Figure 3:
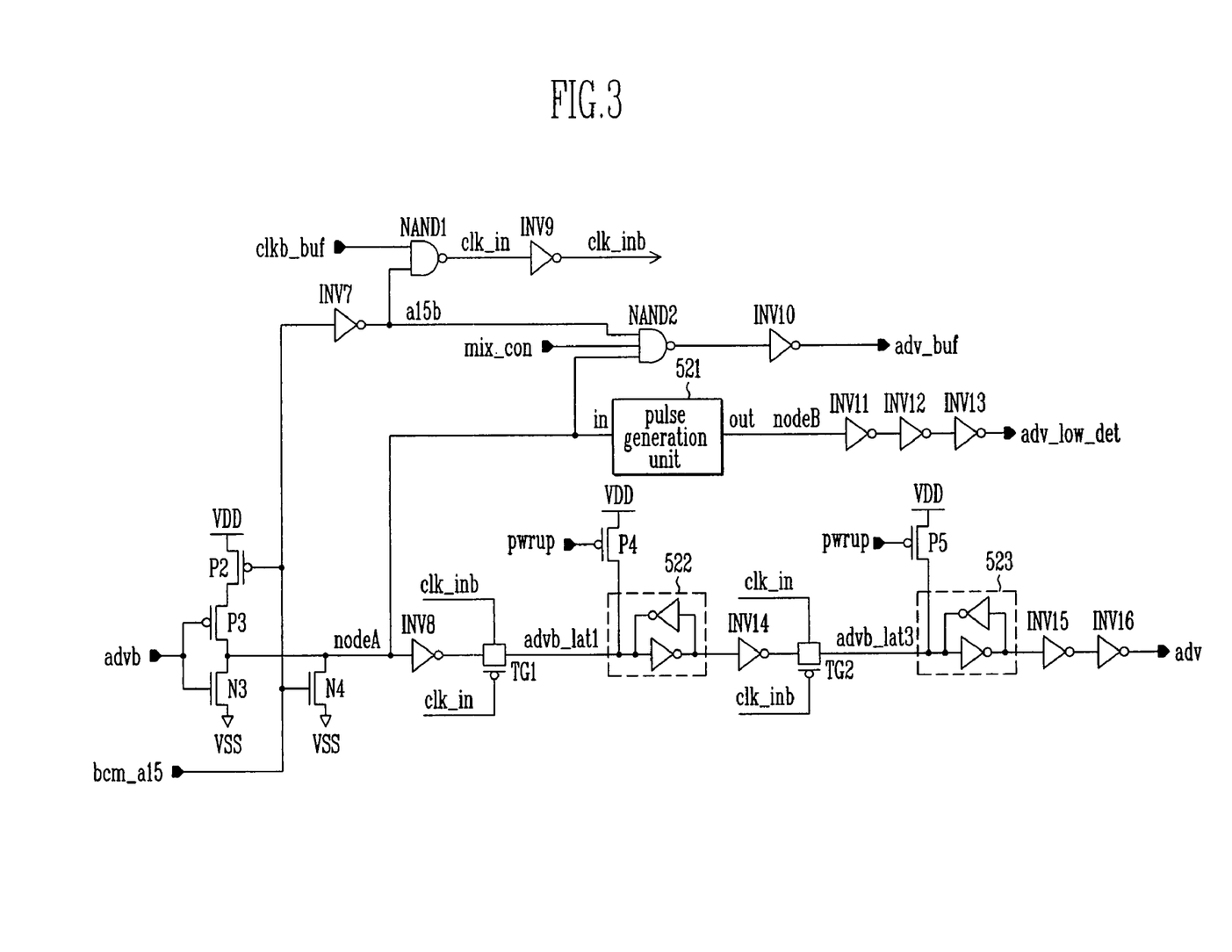
FIG. 3 is a detailed circuit diagram illustrating an address valid buffer unit of FIG. 1.

FIG. 3 is a detailed circuit diagram illustrating the valid address buffer unit 52 of FIG. 1. As shown in FIG. 3, the valid address buffer unit 52 includes NAND gates NAND1 and NAND2, inverters INV7 to INV16, PMOS transistors P2 to P5, NMOS transistors N3 and N4, transmission gates TG1 and TG2, a pulse generation unit 521 and latch units 522 and 523.

Figure 8:
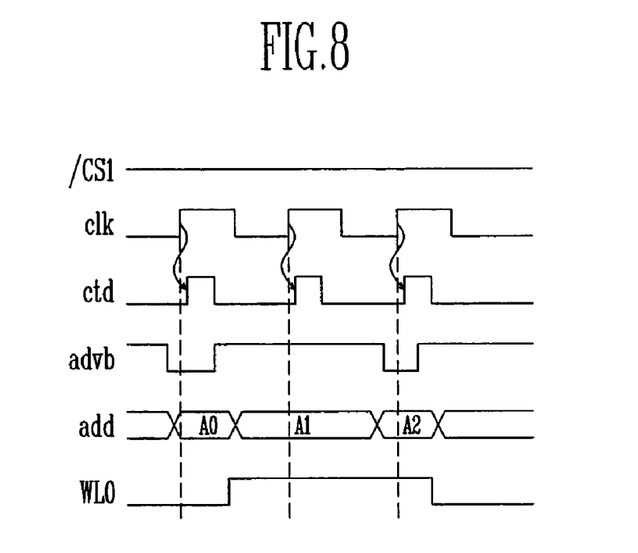
FIG. 8 is an operational waveform diagram of the circuit for controlling the operation mode in a synchronous mode in accordance with a preferred embodiment of the present invention.

Signals inputted to the valid address buffer unit 52 will now be explained with reference to FIG. 1. The valid address buffer unit 52 receives a clock bar buffer signal clkb_buf, the valid address bar signal advb, the mode register setting signal bcm_a15 and the mixed mode operation control signal mix_con. Here, the mode register setting signal bcm_a15 and the mixed mode operation control signal mix_con have been described above. The clock bar buffer signal clkb_buf is decided according to the clock clk. The valid address bar signal advb is directly inputted from an input/output pad. That is, when the clock clk is toggled in the synchronous mode and the valid address bar signal advb maintains a low level, an external address is inputted to enable a corresponding word line. FIG. 8 shows waveforms of the operation. Here, a word line WL0 is enabled.

The operational characteristics of the valid address buffer unit 52 will now be explained with reference to FIG. 7. As explained above, in the asynchronous mode, the mode register setting signal bcm_a15 is fixed to a high level. Therefore, the NMOS transistor N4 is turned on, and thus node A has a low level, the address valid buffer signal adv_buf has a low level, node B has a high level, and the address valid low detection signal adv_low_det has a low level. Here, when a clock in signal clk_in has a high level and a clock in bar signal clk_inb has a low level, the address valid adv maintains a low level. In addition, in the synchronous mode, the mode register setting signal bcm_a15 is fixed to a low level. Accordingly, the address valid buffer signal adv_buf, the address valid low detection signal adv_low_det and the address valid adv are decided according to the valid address bar signal advb. That is, when the mixed mode operation control signal mix_con has a high level (when clock is not toggled) and the valid address bar signal advb is inputted in a low level, the address valid buffer signal adv_buf and the address valid low detection signal adv_low_det all have a high level. In this state, when the clock clk is toggled and the mixed mode operation control signal mix_con is inputted in a low level, the address valid buffer signal adv_buf is transited to a low level. Because the clock in signal clk_in has the same phase as that of the clock clk, the address valid buffer signal adv is decided according to the address valid buffer bar signal advb. That is, when the address valid buffer bar signal advb is inputted in a low level, the address valid buffer signal adv has a high level.

The address buffer unit 53 composes address transmission paths according to the asynchronous write and asynchronous read operation, and the asynchronous write operation and the synchronous write and synchronous read operation in the mixed mode. Here, the address buffer unit 53 differently controls paths for internally transmitting the external address according to the operation modes. That is, as shown in FIG. 4, the address buffer unit 53 has a path 2 for transmitting the external address in the asynchronous mode, a path 1 for transmitting the external address in the asynchronous write operation of the synchronous mode, and a path 2 for transmitting the external address in the synchronous write and synchronous read operation of the synchronous mode.

Figure 4:
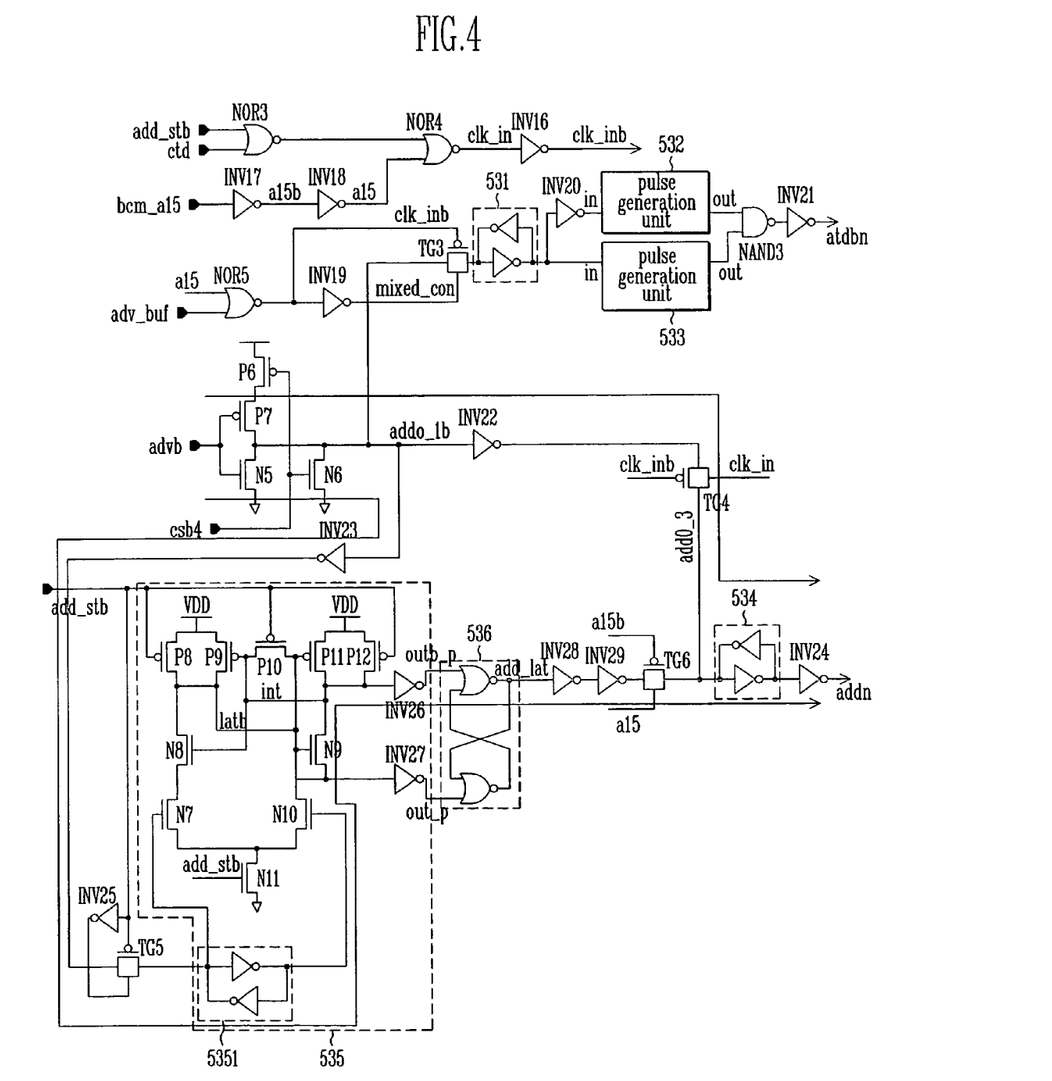
FIG. 4 is a detailed circuit diagram illustrating an address buffer unit of FIG. 1.

FIG. 4 is a detailed circuit diagram illustrating the address buffer unit 53 of FIG. 1. The address buffer unit 53 includes NOR gates NOR3 to NOR5, inverters INV17 to INV30, PMOS transistors P6 to P12, NMOS transistors N5 to N10, transmission gates TG4 to TG6, pulse generation units 532 and 533, a sense amp 535 and latch units 534 and 536.

Signals inputted to the address buffer unit 53 will now be explained with reference to FIG. 1. The address buffer unit 53 receives an address summation bar signal add_stb, the mode register setting signal bcm_a15, the address valid buffer signal adv_buf, a buffer enable signal buf_en, a clock transition detection signal ctd and an address add. Here, the mode register setting signal bcm_a15 and the address valid buffer signal adv_buf have been described above. The clock transition detection signal ctd which detects toggling of the clock clk is transited to a high level by detecting rising of the clock clk. The address summation bar signal add_stb is the output signal from the address transition detection summation unit 54, which will later be explained.

The operational characteristics of the address buffer unit 53 will now be described with reference to FIG. 7. In the asynchronous mode, the mode register setting signal bcm_a15 maintains a high level, and thus the output signal a15 from the inverter INV19 has a high level. Therefore, the output signal mixed_conb from the NOR gate NOR5 has a low level, and the output signal mixed_con from the inverter INV19 has a high level. Accordingly, whenever the address add is toggled, an address transition detection bar signal atdbn is continuously outputted in a low level (refer to FIG. 9). For information, one address transition detection bar signal atdbn is outputted from every address buffer unit 53. That is, the address transition detection bar signals atdbn are outputted as many as the address buffer units 53. On the other hand, the address transition detection bar signal atdb is inputted to the address transition detection summation unit 54. The address transition detection summation unit 54 generates the address summation bar signal add_stb by using the address transition detection bar signal atdb.

The address summation bar signal add_stb is inputted to the sense amp 535 of the address buffer unit 53. When the address summation bar signal add_stb is inputted in a high level, the sense amp 535 is enabled to output the output signals out_p and outb_p. That is, when the address summation bar signal add_stb is inputted in a high level, the output signal out_p has a low level and the output signal outb_p has a high level. Accordingly, an address latch signal add_lat is outputted from the output terminal of the latch unit 536. As explained above, in the asynchronous mode, the output signal a15 has a high level, and thus the address latch signal add_lat is outputted as it is through the transmission gate TG6. Therefore, the address signal addn becomes the address latch signal add_lat (path 2). Here, the clock in signal clk_in has a low level and the clock in bar signal clk_inb has a high level, and thus the transmission gate TG4 is turned off. As a result, the output signal addo_2 from the inverter INV22 is not transmitted through the transmission gate TG4. That is, path 1 is blocked.

Figure 9:
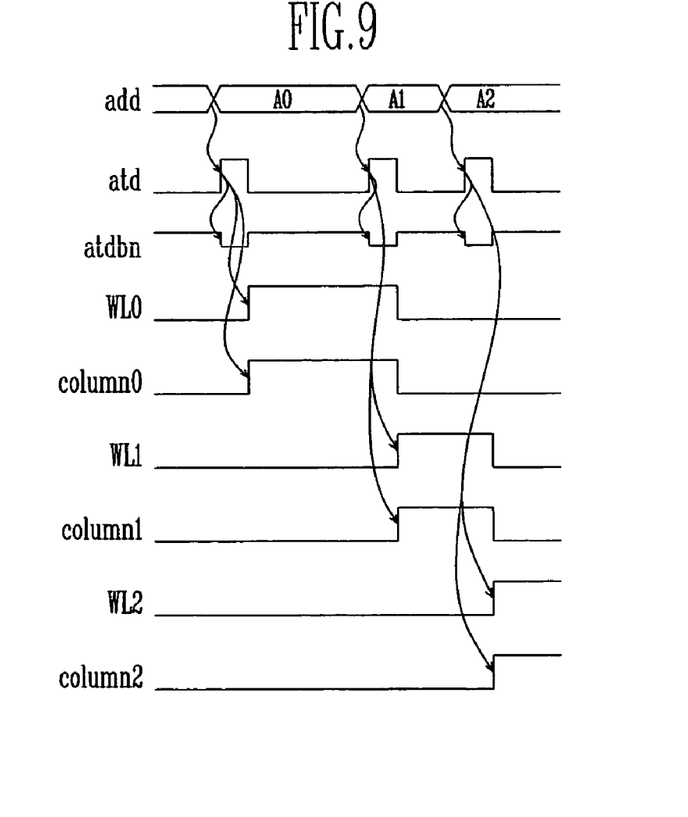
FIG. 9 is an operational waveform diagram of the circuit for controlling the operation mode in an asynchronous mode in accordance with a preferred embodiment of the present invention.

On the other hand, the asynchronous write operation of the synchronous mode is performed when the clock clk is not toggled. That is, when the valid address bar signal advb has a low level and the clock clk is not toggled, the address valid buffer signal adv_buf is transited to a high level. Accordingly, the output signal mixed_con has a high level and the output signal mixed_conb has a low level. As depicted in FIG. 9, whenever the external address is toggled, the address transition detection bar signal atdb has a low level and the address summation bar signal add_stb has a high level. Therefore, the output signal ctd_stb_b from the NOR gate NOR3 has a low level, the clock in signal clk_in has a high level, and the clock in bar signal clk_inb has a low level. Because the clock in signal clk_in has a high level and the clock in bar signal clk_inb has a low level, the transmission gate TG4 is turned on, and the output signal addo_2 from the inverter INV22 is transmitted through the transmission gate TG4. As a result, the address addn becomes the output signal addo_3. That is, the address is transmitted through path 1 of FIG. 4.

In the asynchronous write operation of the synchronous mode, when the clock clk is toggled to enter into the synchronous write and synchronous read operation, the address valid buffer signal adv_buf maintains a low level, the output signal al5 maintains a low level, the output signal mixed_con has a low level, and the output signal mixed_conb has a high level. Therefore, the address transition detection bar signal atdb is not generated. In addition, when the clock clk is toggled, the clock transition detection signal ctd is continuously generated in a high level in rising of the clock clk. Accordingly, the clock in signal clk_in has a high level, the clock in bar signal clk_inb has a low level, and thus the output signal addo_2 is transmitted through the transmission gate TG4. That is, the address is transmitted through path 1 of FIG. 4. As a result, the address add becomes the output signal addo_3.

As illustrated in FIG. 9, in the asynchronous mode, the address transition detection summation unit 54 generates the address summation bar signal add_stb by the address transition detection bar signals atdb0 to atdb2 generated in every toggling of the address add. Here, the mode register setting signal bcm_a15 has a low level, and the mixed mode operation control signal mix_con has a high level. In the asynchronous write operation of the synchronous mode, the address summation bar signal add_stb is generated by the address low detection signal add_low_det generated when the valid address bar signal advb is transited to a low level, or the address transition detection bar signals atdb0 to atdb2 generated when the address add is toggled. Here, a clock top in signal clk_top_in has a low level, and the mixed mode operation control signal mix_con has a high level. In the synchronous write and synchronous read operation, the mixed mode operation control signal mix_con has a low level, and thus the address summation bar signal add_stb maintains a low level regardless of toggling of the address add or the valid address bar signal advb.

Figure 5:
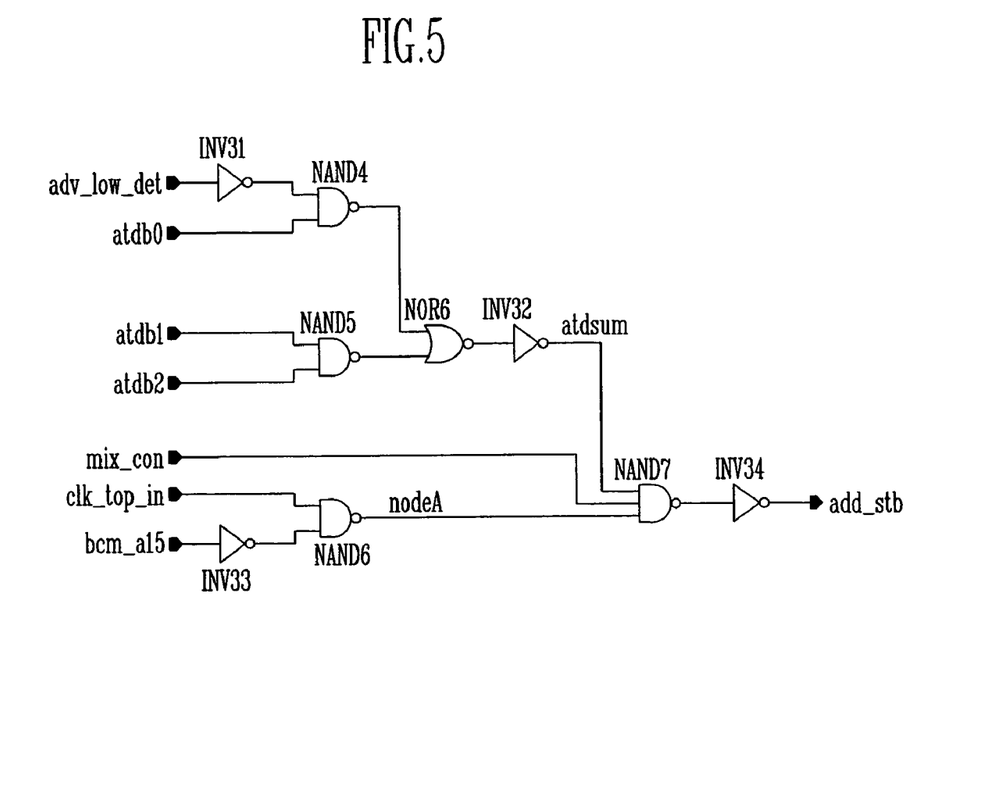
FIG. 5 is a detailed circuit diagram illustrating an address transition detection summation unit of FIG. 1.

FIG. 5 is a detailed circuit diagram illustrating the address transition detection summation unit 54 of FIG. 1. The address transition detection summation unit 54 includes inverters INV31 to INV34, NAND gates NAND4 to NAND7 and a NOR gate NOR6. The address transition detection summation unit 54 receives the address valid low detection signal adv_low_det, the address transition detection bar signals atdb0 to atdb2, the mixed mode operation control signal mix_con, the clock top in signal clk_top_in and the mode register setting signal bcm_a15.

The operational characteristics of the address transition detection summation unit 54 will now be explained with reference to FIG. 7. In the asynchronous mode, the mode register setting signal bcm_a15 has a high level, and thus node A has a high level. In this state, when the initial power up or CS1 is enabled in a low level, the mode operation control signal mix_con has a high level, and thus the address summation bar signal add_stb is enabled in a high level by summation of the address transition detection bar signals atdb0 to atdb2 from the address buffer unit 53. When the mixed mode is enabled in the synchronous mode, namely when the asynchronous write operation is performed, the clock top in signal clk_top_in is controlled to have a low level, and thus node A has a high level. Because the clock clk is not toggled, the mixed mode operation control signal mix_con also has a high level. Here, when the valid address bar signal advb has a low level, the address valid low detection signal adv_low_det has a high level. When the valid address bar signal advb has a low level, if the address add is toggled, the address transition detection bar signal atdb is generated in a low level, and thus the address summation bar signal add_stb is enabled in a high level. When the clock clk is toggled and inputted in the synchronous mode, the mixed mode operation control signal mix_con maintains a low level, and the address summation bar signal add_stb also maintains a low level.

Figure 6:
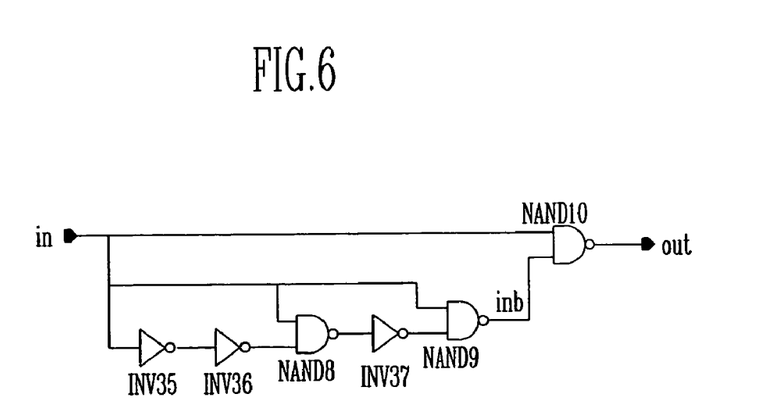
FIG. 6 is a detailed circuit diagram illustrating a pulse generation unit of FIGS. 2 to 4.

On the other hand, the pulse generation units 511, 521, 532 and 533 of FIGS. 2 to 4 can be formed as shown in FIG. 6. Referring to FIG. 6, each of the pulse generation units 511, 521, 532 and 533 includes inverters INV35 to INV37 and NAND gates NAND8 to NAND10. When an input signal in is transited from a low to high level, each of the pulse generation units 511, 521, 532 and 533 generates and outputs a low level output signal out having a small pulse width. That is, when the input signal in is transited from a low to high level, the output signal inb from the NAND gate NAND9 is transited from a high to low level with a predetermined delay, which is opposite in phase to the input signal in. Here, the input signal in and the output signal inb all have a high level, and the output signal out has a low level.

As discussed earlier, in accordance with the present invention, the asynchronous write and synchronous read operation and the synchronous write and synchronous read operation can be performed at the same time, by performing the synchronous write and synchronous read operation when the clock is toggled and inputted in the chip-enabled state, and performing the asynchronous write operation when the clock is not toggled in the chip-enabled state. Accordingly, an efficient interface is provided between the PSRAM and the NOR flash memory device.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A method for controlling an operation mode of a PSRAM, comprising the steps of:
    performing a synchronous write and synchronous read operation by enabling a word line according to an valid address bar signal when a clock is toggled; and
    performing an asynchronous write operation by enabling the word line by toggling an external address when the clock is not toggled, in order to change an enable time point of the word line by varying an external address path according to toggling/non-toggling of the clock in a chip-enabled state after entering into a synchronous mode by a mode register setting signal.

2. The method of claim 1, wherein, when the valid address bar signal has a first level and the clock rises, the synchronous write and synchronous read operation is performed.

3. The method of claim 1, wherein the mode register setting signal maintains a first level in the synchronous mode and a second level in the asynchronous mode.

4. The method of claim 1, wherein, when the valid address bar signal maintains a first level, whenever the external address is toggled, the asynchronous write operation is performed.

5. The method of claim 1, wherein the external address is transmitted through the same path in the asynchronous write operation and the synchronous write and synchronous read operation of the synchronous mode.

6. The method of claim 1, wherein the external address is transmitted through different paths in the synchronous mode and the asynchronous mode.

7. A circuit for controlling an operation mode of a PSRAM, comprising:
    a mixed mode operation control unit for deciding toggling/non-toggling of a clock according to a mode register setting signal in a chip-enabled state, and outputting a corresponding mixed mode operation control signal;
    an address valid buffer unit for deciding whether a current mode is a synchronous mode or an asynchronous mode according to the mode register setting signal and an valid address bar signal from an input/output pad on the basis of the mixed mode operation control signal from the mixed mode operation control unit;
    an address buffer unit for deciding different external address transmission paths in the synchronous mode and the asynchronous mode according to the mode register setting signal, an external address and the clock on the basis of an address valid buffer signal from the address valid buffer unit; and
    an address transition detection summation unit for generating an address summation signal for deciding the external address transmission path in the asynchronous mode according to the mode register setting signal and the mixed mode operation control signal on the basis of an address transition detection bar signal from the address buffer unit, and outputting the address summation signal to the address buffer unit.

8. The circuit of claim 7, wherein the mixed mode operation control signal has a second level according to an initial power up signal, maintains a second level in the asynchronous mode according to the mode register setting signal, is transited to a first level in the synchronous mode according to the mode register setting signal when the clock is toggled, and maintains the second level when the clock is not toggled.

9. The circuit of claim 7, wherein the address valid buffer unit outputs a second level address valid signal in the asynchronous mode according to the mode register setting signal, and generates and outputs the address valid buffer signal in the synchronous mode according to the valid address bar signal.

10. The circuit of claim 9, wherein the address valid buffer signal has a second level when the valid address bar signal has a first level, and is transited to a first level when the clock is toggled.

11. The circuit of claim 7, wherein the address buffer unit continuously outputs the address transition detection bar signal in the asynchronous mode according to the mode register setting signal in every toggling of the external address, and outputs the external address through a first path.

12. The circuit of claim 7, wherein the address buffer unit transits the address summation bar signal to a first level, by transiting the address valid buffer signal to a second level when the valid address bar signal has a first level and the clock is not toggled in the synchronous mode, and transiting the address transition detection bar signal to a low level in every toggling of the external address, and outputs the external address through a second path, for performing the asynchronous write operation.

13. The circuit of claim 7, wherein the address buffer unit prevents generation of the address transition detection bar signal by transiting the address valid buffer signal to a first level in the synchronous mode, and when the clock is toggled and inputted, the address buffer unit outputs the external address through a second path, for performing the synchronous write and read operation.

14. The circuit of claim 7, wherein the address transition detection summation unit outputs the address summation bar signal in a second level by summation of the address transition detection bar signals from the address buffer unit on the basis of the mode register setting signal in the asynchronous mode.

15. The circuit of claim 7, wherein, when the clock is not toggled in the synchronous mode, the valid address bar signal has a first level, and when the external address is toggled, the address transition detection bar signal is generated and inputted in a first level, and the address transition detection summation unit generates and outputs the address summation bar signal in a second level.

16. The circuit of claim 7, wherein, when the clock is toggled in the synchronous mode, the mixed mode operation control signal is generated and inputted in a first level, and the address transition detection summation unit generates and outputs the address summation bar signal in a first level.

17. The circuit claim 7, wherein the mode register setting signal maintains a first level in the synchronous mode and a second level in the asynchronous mode.

18. A PSRAM, comprising:
    a memory cell array having a plurality of memory cells;

a main decoder unit for selecting the corresponding memory cell from the memory cells of the memory cell array; and a circuit for controlling an operation mode which transmits an external address to the main decoder unit, for performing an asynchronous write operation or a synchronous write and synchronous read operation in a synchronous mode according to toggling/non-toggling of a clock, as recited in claim 7.

19. A method for performing an operation mode of a PSRAM, comprising the steps of:

deciding, at a mixed mode operation control unit, toggling/non-toggling of a clock according to a mode register setting signal in a chip-enabled state;

deciding, at an address valid buffer unit, whether a current mode is a synchronous mode or an asynchronous mode according to the mode register setting signal and an valid address bar signal from an input/output pad on the basis of a mixed mode operation control signal from the mixed mode operation control unit;

deciding, at an address buffer unit, different external address transmission paths in the synchronous mode and the asynchronous mode according to the mode register setting signal, an external address and the clock on the basis of an address valid buffer signal from the address valid buffer unit; and performing, in the synchronous mode, an asynchronous write operation by toggling the external address when the clock is not toggled, and a synchronous write and synchronous read operation when the clock is toggled.

* * * * *